(12) United States Patent
Yamada et al.

(10) Patent No.: US 7,358,660 B2
(45) Date of Patent: Apr. 15, 2008

(54) ORGANIC ELECTROLUMINESCENCE DEVICE AND MATERIAL THEREOF

(75) Inventors: Tomohisa Yamada, Funabashi (JP); Takuji Yoshimoto, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 506 days.

(21) Appl. No.: 10/512,988

(22) PCT Filed: Apr. 28, 2003

(86) PCT No.: PCT/JP03/05437

§ 371 (c)(1),
(2), (4) Date: Oct. 29, 2004

(87) PCT Pub. No.: WO03/094578

PCT Pub. Date: Nov. 13, 2003

(65) Prior Publication Data

US 2005/0221117 A1     Oct. 6, 2005

(30) Foreign Application Priority Data

May 1, 2002    (JP) .............................. 2002-129608

(51) Int. Cl.
*H01L 51/54* (2006.01)
(52) U.S. Cl. ...................... 313/504; 313/506; 428/690; 428/917; 257/40; 257/E51.038
(58) Field of Classification Search ...................... None
See application file for complete search history.

(56) References Cited

U.S. PATENT DOCUMENTS

| 4,379,070 | A | * | 4/1983 | Tick ........................ 252/301.16 |
| 4,539,507 | A | | 9/1985 | VanSlyke et al. |
| 4,720,432 | A | | 1/1988 | VanSlyke et al. |
| 4,764,625 | A | | 8/1988 | Turner et al. |
| 4,923,774 | A | | 5/1990 | Van der Auweraer et al. |
| 5,061,569 | A | | 10/1991 | VanSlyke et al. |
| 5,153,073 | A | | 10/1992 | Ohnuma et al. |
| 5,256,945 | A | | 10/1993 | Imai et al. |
| 5,330,866 | A | | 7/1994 | Ueda |
| 2007/0020479 | A1 | * | 1/2007 | Uetani et al. ............... 428/690 |

FOREIGN PATENT DOCUMENTS

| EP | 1 089 361 A2 | 4/2001 |
| JP | 59-194393 A | 11/1984 |
| JP | 63-295695 A | 12/1988 |
| JP | 4-129271 A | 4/1992 |
| JP | 4-175395 A | 6/1992 |
| JP | 4-264189 A | 9/1992 |
| JP | 4-304466 A | 10/1992 |
| JP | 4-308688 A | 10/1992 |
| JP | 4-364153 A | 12/1992 |
| JP | 5-25473 A | 2/1993 |
| JP | 5-234681 A | 9/1993 |
| JP | 5-239455 A | 9/1993 |
| JP | 5-310949 A | 11/1993 |
| JP | 8-20771 A | 1/1996 |
| JP | 8-40995 A | 2/1996 |
| JP | 8-40997 A | 2/1996 |
| JP | 9-188756 A | 7/1997 |
| JP | 11-283750 A | 10/1999 |
| JP | 2000-36390 A | 2/2000 |
| JP | 2001-244079 A | 9/2001 |
| JP | 2002-56985 A | 2/2002 |
| JP | 2003-68464 A | 3/2003 |
| WO | WO 2005/109109 A1 | * 11/2005 |

OTHER PUBLICATIONS

Erabi et al., "2,6-dimethoxyphenyl-ki o yusuru ikutsuka no antei carbenium-en no cyclic voltammetry", Dai 25 Kai Electro Organic Chemistry Toronkai Koen Yoshishu (2001), pp. 35-36.
Tang et al., "Organic electroluminescent diodes", Appl. Phys. Lett., vol. 51, No. 12 (1987) pp. 913-915.
Kido et al., "Organic electroluminescent device with aromatic amine-containing polymer as a hole transport layer (II): poly(arylene ether sulfone)-containing tetraphenylbenzidine", Polymers for Advanced Technologies, vol. 7, pp. 31-34, Jan. 1996.

* cited by examiner

*Primary Examiner*—Marie Yamnitzky
(74) *Attorney, Agent, or Firm*—Birch, Stewart, Kolasch & Birch, LLP (57) ABSTRACT

An organic electroluminescence device capable of solving the problem of realization of low-voltage driving and high luminance which is important for the prolongation of the life thereof, the organic electroluminescence device comprising a luminous layer composed of a single or a plurality of organic compound thin films interposed between a positive electrode and a negative electrode, characterized in that at least one layer containing a compound having carbenium ion is arranged therein; and a charge transport material (e.g., hole transport material for the organic electroluminescence device) characterized in that a compound having carbenium ion is contained therein.

6 Claims, 2 Drawing Sheets

ORGANIC ELECTROLUMINESCENCE DEVICE AND MATERIAL THEREOF

TECHNICAL FIELD

The present invention relates to an organic electroluminescence device and a material thereof. More particularly, the present invention relates to an organic electroluminescence device that emits light upon application of voltage to its emission layer of an organic compound and relates also to a charge transport material incorporated thereinto.

BACKGROUND ART

An organic electroluminescence device capable of emission with a luminance of about 1000 cd/m$^2$ at a driving voltage equal to or lower than 10 V was reported by Tang et al. of Eastman Kodak in 1987. See Appl. Phys. Lett., vol. 51, p. 913, 1987.

Tang et al. searched for the optimal electrode and organic compound that would increase the emission efficiency of the device. They prepared an organic electroluminescence device in which the hole transport layer is an aromatic amine compound and the electron transport emission layer is an aluminum complex of 8-hydoxyquinoline. This device emits light when it has DC voltage applied across its electrodes. The DC voltage injects holes through the anode and electrons through the cathode, so that they undergo recombination in the emission layer to emit light.

Among the known hole transport materials are aromatic diamine derivatives (disclosed in Japanese Patent Laid-open Nos. Hei 8-20771, Hei 8-40995, and Hei 8-40997) and aromatic amine-containing polymers (disclosed in Japanese Patent Laid-open Nos. Hei 11-283750 and 2000-36390).

Among the known hole injection materials are phthalocyanine derivatives and aromatic triamines of starburst type (disclosed in Japanese Patent Laid-open Nos. Sho 63-295695 and Hei 4-308688).

The existing organic electroluminescence devices have some problems to be addressed. That is, they need to have a longer life, to work at a lower driving voltage, and to work with a constant current without voltage increase and luminance decrease. Although no elucidation has been made yet, the performance of the device seems to depend on the properties (such as glass transition temperature and melting point) of the organic materials constituting the device. The device made of an organic material poor in heat resistance tends to break during continuous operation.

Any device with a short life or a high driving voltage poses a problem when used as the light source for facsimile, copying machine, and back light of liquid crystal display, particularly, the device is not desirable for display.

It is an object of the present invention to provide an organic electroluminescence device capable of high luminance emission at a low driving voltage (for a longer life) and a material used for the device.

DISCLOSURE OF INVENTION

The present inventors conducted a series of researches to tackle the above-mentioned problems. As a result, they found the organic electroluminescence device and the material to be used therefor, which are defined in the present invention.

It is an object of the present invention to provide an organic electroluminescence device of the type having one or more than one emission layer in the form of thin film of an organic compound between paired electrodes (anode and cathode), which includes at least one layer containing a compound with carbenium ions.

As used herein, the term "layer containing a compound with carbenium ions" shall mean a charge transport layer, which includes, for example, electron injection layer, electron transport layer, hole transport layer, and hole injection layer.

It is another object of the present invention to provide a material containing a compound with carbenium ions, which is used for the organic electroluminescence device. This material is a charge transfer material that forms the above-mentioned layers. It includes, for example, electron injection material, electron transport material, hole injection material, and hole transport material. The one for hole transport and hole injection is preferable.

BEST MODE FOR CARRYING OUT THE INVENTION

The organic electroluminescence device according to the present invention is one which has one or more than one emission layer in the form of thin film of an organic compound between paired electrodes. It is characterized in having at least one layer containing a compound with carbenium ions. This layer may be a hole transport layer, hole injection layer, electron transport layer, or electron injection layer, for example.

The embodiments of the organic electroluminescence device according to the present invention will be described below with reference to FIGS. 1 to 5, which are schematic diagrams illustrating the structure of the device and are not intended to restrict the scope of the present invention.

FIGS. 1 to 5 are schematic diagrams illustrating the embodiments of the organic electroluminescence device according to the present invention. In these figures, there are shown a cathode 1, an emission layer 2, a hole transport layer 3, an anode 4, a substrate 5, a hole injection layer 6, an electron injection layer 7, and an electron transport layer 8.

As shown in the figures, the layer of organic compound held between paired electrodes is composed of an emission layer and at least one charge transport layer (such as electron injection layer, electron transport layer, hole transport layer, and hole injection layer). According to the present invention, at least one of the charge transport layers should contain a compound with carbenium ions.

The charge transport layer containing a compound with carbenium ions improves the efficiency of electron and hole injection into the emission layer, thereby permitting the organic electroluminescence device to emit light at a low voltage.

Figure 1:
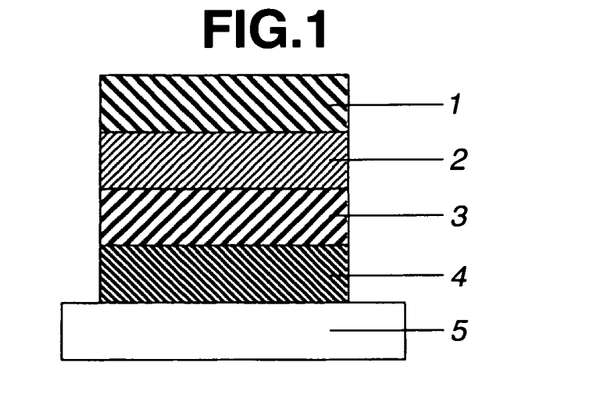
FIG. 1 is a schematic sectional view showing one embodiment of the organic electroluminescence device according to the present invention.
Figure 2:
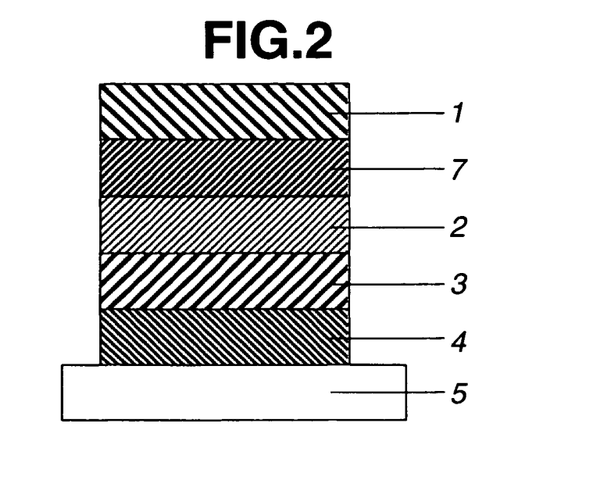
FIG. 2 is a schematic sectional view showing another embodiment of the organic electroluminescence device according to the present invention.
Figure 3:
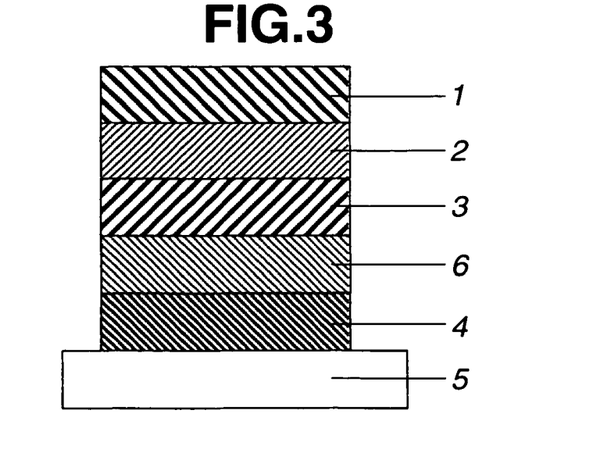
FIG. 3 is a schematic sectional view showing another embodiment of the organic electroluminescence device according to the present invention.
Figure 4:
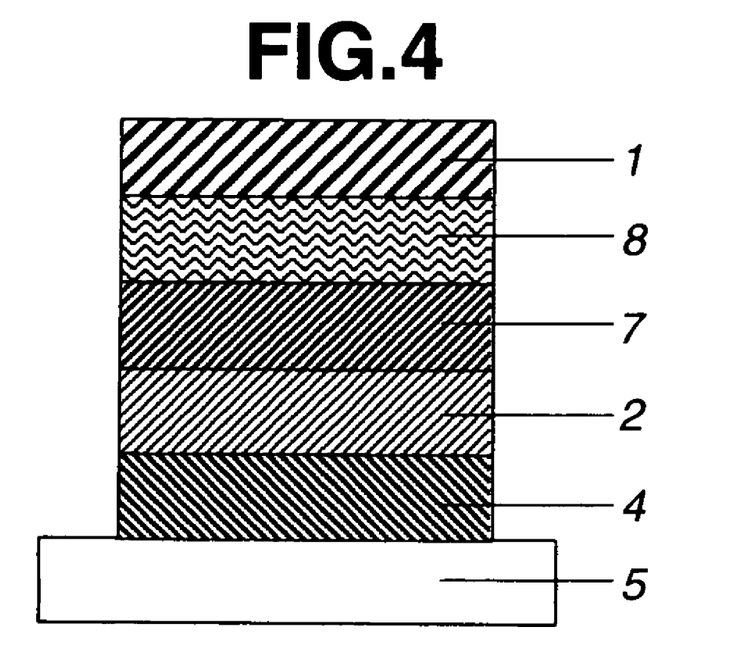
FIG. 4 is a schematic sectional view showing another embodiment of the organic electroluminescence device according to the present invention.
Figure 5:
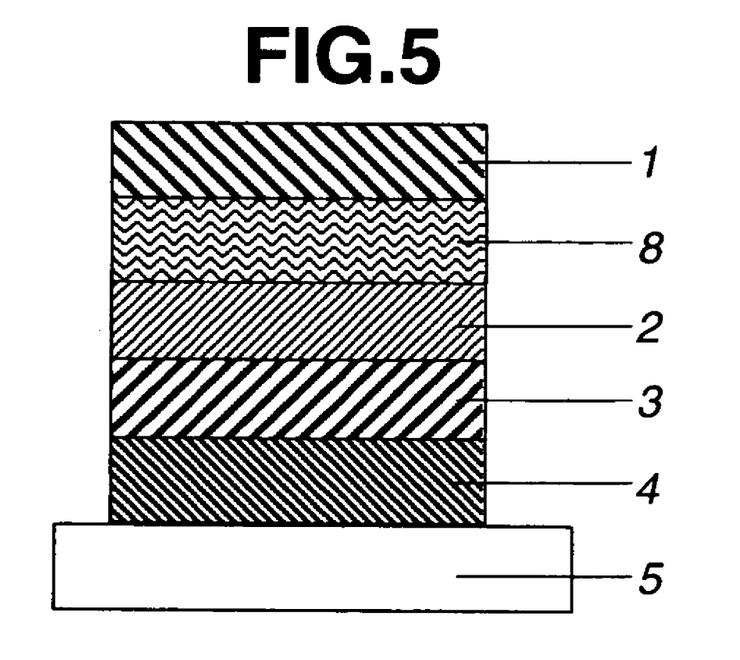
FIG. 5 is a schematic sectional view showing another embodiment of the organic electroluminescence device according to the present invention.

In a preferred embodiment, the layer containing a compound with carbenium ions should be used as a hole transport layer 3, so that the efficiency of hole injection into the emission layer 2 improves and the organic electroluminescence device emits light at a low voltage. In another preferred embodiment, the layer containing a compound with carbenium ions should be used as both of a hole transport layer 3 and a hole injection layer 6, or either of a hole transport layer 3 or a hole injection layer 6, as shown in FIGS. 2 and 3, so that the efficiency of hole injection into the emission layer 2 improves and the organic electroluminescence device emits light at a low voltage.

According to the present invention, the compound with carbenium ions is one which is represented by the formula (1) below.

(1)

(where $Ar^1$ to $Ar^3$ denote identical or different, substituted or unsubstituted aromatic groups, with at least one of them being a monovalent substituent group represented by the formula (2) below.

(2)

where $Ar^4$ to $Ar^6$ denote substituted or unsubstituted aromatic groups which are identical with or different from $Ar^1$ to $Ar^3$, respectively; Y denotes a single bond, —O—, or a divalent organic group selected from $C_{1-6}$ alkylene group, —COO—, —CONH—, 9H-fluorenylene group, and 9,9-dimethyl-9H-flurorenylene group; and $R^-$ denotes an anion species.)

In the formula (1) above, $Ar^1$ to $Ar^6$ may be identical or different, substituted or unsubstituted aromatic groups. Unsubstituted aromatic groups include, for example, phenyl group, biphenyl group, triphenyl group, tetraphenyl group, naphthyl group, phenanthrenyl group, fluorenyl group, and anthranyl group.

The substituted aromatic group mentioned above has any of the following substituent groups. $C_{1-6}$ alkyl groups, $C_{1-6}$ alkoxy groups, amino groups, $C_{1-4}$ mono- or dialkyl substituted amino groups, $C_{1-6}$ thioalkyl groups, and cyano groups. Preferable among these groups are electron-donating groups, which include $C_{1-4}$ alkyl groups, such as methyl group, ethyl group, propyl group, isopropyl group, butyl group, isobutyl group, s-butyl group, and t-butyl group; $C_{1-4}$ alkoxy groups, such as methoxy group, ethoxy group, propoxy group, isopropoxy group, butoxy group, isobutoxy group, s-butoxy group, and t-butoxy group; and amino groups, methylamino groups, dimethylamino groups, ethylamino groups, and diethylamino groups. The number of these substituent groups is usually 1 to 3.

More desirable examples of the aromatic groups $Ar^1$ to $Ar^6$ include phenyl groups, o-, m-, and p-tolyl groups, xylyl groups, o-, m-, and p-cumenyl groups, biphenyl groups, naphthyl groups, 4-methoxy-phenyl groups, 9H-fluorenyl groups, and 9,9-dimethyl-9H-flurorenyl groups.

In the formula (2) above, Y in the substituent group denotes a single bond, —O—, or a divalent organic group selected from $C_{1-6}$ alkylene group, —COO—, —CONH—, 9H-fluorenylene group, and 9,9-dimethyl-9H-fluorenylene group. Preferable among these examples are a single bond, —O—, and a divalent organic group selected from $C_{1-4}$ alkylene group, 9H-fluorenylene group, and 9,9-dimethyl-9H-flurorenylene group.

According to the present invention, the compound with carbenium cations includes an oligomer or a polymer in which the main chain has the structure of the formula (1), with the substituent groups represented by the formula (2) repeatedly binding to $Ar^5$ and $Ar^6$. It also includes an oligomer or a polymer in which the side chains have the substituent groups represented by the formula (2).

The carbenium cation represented in the formula (1) above has a counter ion indicated by R—. This anion includes, for example, $SbX_6^-$, $PX_6^-$, $TaX_6^-$, $ClO_4^-$, $ReO_4^-$, $BX_4^-$, $AsX_6^-$, and $AlX_6^-$. Of these examples, $SbX_6^-$ is preferable (where X denotes a halogen atom). The halogen atom includes fluorine atom, chlorine atom, bromine atom, and iodine atom, with the former two being preferable.

The compound represented by the formula (1) may be synthesized in any way without specific restrictions. The process for synthesis may consist of the following three steps, assuming that the anion is $SbCl_6^-$ and $Ar^1$ is a mono-halogenated phenyl compound (X—$Ar^1$, where X is Cl, Br, or I).

Step (i): In this step, a mono-halogenated phenyl compound is dissolved in a solvent (such as THF) under a nitrogen atmosphere. The solution is cooled with dry ice to about −78° C. A lower alkyl lithium compound (such as n-butylliyhium) is added dropwise in an amount equimolar with the mono-halogenated phenyl compound. After stirring for 30 minutes to 1 hour, the solution is given dropwise a benzophenone compound (dissolved in a solvent such as THF) in an amount equimolar with the mono-halogenated phenyl compound. The solution is allowed to cool to room temperature to terminate reaction. The reaction time is usually 3 to 24 hours, depending on conditions. The reaction product is cleaned of residual n-butyllithium by washing with methanol-water mixed solvent. Upon solvent removal, there is obtained the desired triphenyl methanol compound, which is subsequently purified by column chromatography or the like.

Step (ii): In this step, the triphenyl methanol compound is stirred in excess acetyl chloride (as a solvent) so that the hydroxyl group is chlorinated. The reaction temperature ranges from room temperature to 60° C., and the reaction time ranges from 3 hours to 7 hours. After acetyl chloride has been removed, there is obtained the desired triphenylchloromethane compound.

Step (iii): In this step, the triphenylchloromethane compound (which has been obtained under a nitrogen atmosphere) is dissolved in a halogenated hydrocarbon solvent. The resulting solution is given slowly dropwise a solution of halogenated hydrocarbon solvent in which is dissolved antimony pentachloride in an amount equimolar with the triphenylchloromethane compound. Precipitates (as the reaction product) are recovered by filtration, which is followed by washing (several times) with hexane-chloroform mixed solvent. Upon vacuum drying, the desired product is obtained.

Other compounds may also be synthesized in the same way as mentioned above. Incidentally, some of the triphenylchloromethane compounds are commercially available as reagents.

Shown below examples within the scope of the present invention. The scope of the present invention is not limited to them. Incidentally, Me denotes methyl group in the following formulas.

| Compound | Chemical Structure |
|---|---|
| A-1: |  |
| A-2: |  |
| A-3: |  |
| A-4: |  |

-continued

| Compound | Chemical Structure |
|---|---|
| A-5: | (4-methoxyphenyl)diphenylmethyl cation, SbCl$_6^-$ |
| A-6: | bis(4-methoxyphenyl)(phenyl)methyl cation, SbCl$_6^-$ |
| A-7: | tris(4-methoxyphenyl)methyl cation, SbCl$_6^-$ |
| A-8: | (4-biphenylyl)diphenylmethyl cation, SbCl$_6^-$ |
| A-9: | 2,7-bis(diphenylmethylium)-9H-fluorene, 2 SbCl$_6^-$ |

-continued

| Compound | Chemical Structure |
|---|---|
| A-10: |  |
| A-11: |  |
| A-12: |  |
| A-13: |  |
| A-14: |  |

| Compound | Chemical Structure |
|---|---|
| A-15: | (structure) |
| A-16: | (structure) |
| A-17: | (structure) |
| A-18: | (structure) |

-continued

| Compound | Chemical Structure |
|---|---|
| A-19: |  |
| A-20: |  |
| A-21: |  |
| A-22: |  |

-continued

| Compound | Chemical Structure |
|---|---|
| A-23: | Triphenylmethyl cation with naphthyl and p-tolyl substituents, SbCl$_6^-$ counterion |
| A-24: | Triphenylmethyl cation with naphthyl and p-methoxyphenyl substituents, SbCl$_6^-$ counterion |
| A-25: | Triphenylmethyl cation with two naphthyl and one p-methoxyphenyl substituents, SbCl$_6^-$ counterion |

According to the present invention, the compound with carbenium ions may be used alone as the charge transport material, or the polymer containing a compound with carbenium ions in the main chain or side chain may be used alone as the charge transport material. More than one of such compounds or polymers may be used in combination with one another. Also, the compound with carbenium ions may be mixed with any other charge transport material. Alternatively, the compound with carbenium ions may be combined with a compound capable of charge transfer to form a polymer. Such materials may be used alone or in combination with one another.

The layer containing carbenium ions may be formed by coating and ensuing drying (on a substrate or another layer) from a solvent solution containing a compound with carbenium ions. Coating may be accomplished by spin coating, printing, or the like.

The solvent used for coating includes, for example, halogenated hydrocarbon solvents (such as chloroform, dichloromethane, dichloroethane, trichloroethylene, ethylene dichloride, tetrachloroethane, and chlorobenzene), aprotic polar solvents (such as N-methyl-2-pyrrolidone (NMP), dimethylformamide (DMF), dimethylacetamide (DMAc), and dimethylsulfoxide (DMSO)), and polar solvents (such as propylene glycol monobutyl ether, dipropylene glycol monomethyl ether, dipropylene glycol monoethyl ether, and other alkoxy alcohols).

The compound with carbenium ions may be used alone as the hole transport material. It may also be mixed with any other hole transport material for improvement in its characteristic properties.

Examples of other hole transport materials are listed below.

1,1-bis(4-di-p-triphenylaminophenyl)cyclohexane, which is an aromatic amine compound having a tertiary aromatic amine unit connected thereto. (Japanese Patent Laid-open No. Sho 59-194393)

4,4-bi[N-(naphthyl)-N-phenylamino]biphenyl or its analog, which is an aromatic amine compound having two or more tertiary amine groups and two or more condensed aromatic rings substituting for the nitrogen atoms. (Japanese Patent Laid-open No. Hei 5-234681)

Aromatic triamine of starburst structure, such as a derivative of trtiphenylbenzene. (U.S. Pat. No. 4,923,774)

Aromatic diamine, such as N,N'-diphenyl-N,N'-1-bis(3-methylphenyl)biphenyl-4,4'-diamine. (U.S. Pat. No. 4,764,625)

Triphenylamine derivative which is sterically asymmetric as the entire molecule. (Japanese Patent Laid-open No. Hei 4-129271)

A compound having more than one aromatic diamine group as substituents for the pyrenyl group. (Japanese Patent Laid-open No. Hei 4-175395)

Aromatic diamine composed of tertiary aromatic amine units connected through an ethylene group. (Japanese Patent Laid-open No. Hei 4-264189)

Aromatic diamine with a styryl structure in which aromatic tertiary amine units are connected through a thiophene group. (Japanese Patent Laid-open No. Hei 4-304466)

Aromatic triamine of starburst type. (Japanese Patent Laid-open No. Hei 4-308688)

Benzylphenyl compound (Japanese Patent Laid-open No. Hei 4-364153)

A compound composed of tertiary amines connected through a fluorene group. (Japanese Patent Laid-open No. Hei 5-25473)

Triamine compound. (Japanese Patent Laid-open No. Hei 5-239455)

These materials may be used alone or in combination with one another.

Additional examples of hole transport materials include polyvinylcarbazole, polysilane, polyphosphazene (Japanese Patent Laid-open No. Hei 5-310949), polyamide, polybiphenylamine, and polymer having a triphenylamine skeleton. These examples are not limitative. They may be used alone or in combination with one another.

A compound with carbenium ions may be used alone as an electron transfer material, or it may be used in combination with another electron transfer material for improvement in its characteristic properties.

Examples of other electron transfer materials include nitro-substituted fluorenone derivatives, nitro-substituted fluorene derivatives, thiopyran dioxide derivatives, diphenone derivatives, perylene tetracarboxyl derivatives, anthraquionodimethane derivatives, fluoronylidenemethane derivatives, perylene derivatives, oxadiazole derivative and polymers, quinoline derivatavies, triazole derivatives and polymers, and imidazole derivatives. These examples are not limitative. They may be used alone or in combination with one another.

According to the present invention, the anode 4 is a transparent electrode having a surface resistance of 1 to 50 $\Omega/\square$ and a visible ray transmittance equal to or higher than 80%. It should preferably be a transparent film formed from indium-tin oxide (ITO) or zinc oxide-aluminum in amorphous form or microcrystalline form. Alternatively, it should preferably be a transparent film of laminate structure formed on the transparent insulating substrate 1 (such as glass and plastic film) by vacuum deposition or sputtering. The transparent film of laminate structure is composed of a core layer (about 10 nm thick) of silver, chromium, copper, or copper-silver alloy (which serves to reduce resistance) and outer layers of ITO, titanium oxide, or tin oxide (in amorphous or microcrystalline form). The anode may also be a semi-transparent electrode having gold or platinum deposited thereon or a semi-transparent electrode having a polymer (such as polyaniline, polythiophene, and polypyrrole) coated thereon.

The emission layer 2 is formed from any of aromatic amine compounds, coumarin compounds (as a laser dye), perylene derivatives, anthracene derivatives, rubrene derivatives, and tris(8-hydroxyquinoline)-aluminum metal complex.

The cathode 1 is formed from any of metal (with a small work function), alloy thereof, electrically conductive compounds, and mixtures thereof. Examples of such metals include Na, K, Mg, Li, and In. The cathode may be formed by vacuum deposition or sputtering.

EXAMPLES AND COMPARATIVE EXAMPLES

The invention will be described in more detail with reference to the following examples and comparative examples, which are not intended to restrict the scope thereof.

Comparative Example 1

A glass substrate with ITO was cleaned with a neutral detergent and then ultrasonically washed sequentially in water, acetone, and isopropanol. It further underwent boiling in isopropanol and UV-ozone cleaning. The organic layer and cathode were formed by vacuum deposition. Thus there was obtained the desired device.

The hole transport material was commercial α-naphthylphenyldiamine (α-NPD, purified by sublimation). The vacuum deposition for the hole transport material was carried out at a degree of vacuum no higher than $8\times10^{-4}$ Pa. The vacuum deposition was also carried out at a rate of 0.3 nm/s until the deposited film became 50 nm thick.

α-NPD

On the hole transport layer was formed the emission layer from commercial tris(8-hydroxyquinoline)aluminum (Alq3) (purified by sublimation). The vacuum deposition of the emission layer was carried out at a degree of vacuum no higher than $8\times10^{-4}$ Pa. The vacuum deposition was also carried out at a rate of 0.3 nm/s until the deposited film became 50 nm thick.

Alq3

Further, the electron injection layer was formed from lithium fluoride (LiF). The vacuum deposition of the electron injection layer was carried out at a degree of vacuum no higher than $8\times10^{-4}$ Pa. The vacuum deposition was also carried out at a rate of 0.01 nm/s until the deposited film became 0.5 nm thick. Finally, the cathode was formed from aluminum. The vacuum deposition of the cathode was carried out at a degree of vacuum no higher than $8\times10^{-4}$ Pa. The vacuum deposition was also carried out at a rate of 0.2 nm/s until the deposited film became 100 nm thick. The thus obtained device has the characteristic properties shown in Table 1.

Example 1

The hole injection layer 3 was formed on the ITO substrate by spin coating under the following conditions from the compound designated as A-6 above.

Conditions of spin coating:
Solvent: chloroform
Solids: 0.2% by weight

Spinner speed: 3500 rpm

Duration of spinning: 5 seconds

On the spin-coated layer were formed the hole transport layer, emission layer, electron injection layer, and cathode in the same way as in Comparative Example 1. Thus there was obtained the desired organic electroluminescence device. It has the characteristic properties shown in Table 1. Incidentally, the compound A-6 mentioned above was synthesized in the following manner.

A 300-ml three-mouth flask was charged with 150 ml of dehydrated chloroform. In this chloroform was dissolved 5 g (0.014 mol) of 4,4'-dimethoxytrityl chloride (reagent made by Tokyo Kasei Kogyo Co. Ltd.) under a nitrogen atmosphere. To the solution was slowly (dropwise) added 5 g (0.0168 mol) of antimony pentachloride. The reactants were allowed to react at room temperature for 3 hours. After reaction, the solution was added dropwise to 1000 ml of hexane, and precipitates were recovered by filtration. Thus there was obtained 8 g (0.0126 mol) of A-6 (yields=90%).

Example 2

The hole injection layer 3 was formed from A-6 on the ITO glass substrate by spin coating under the following conditions.

Conditions of spin coating:

Solvent: propylene glycol monomethyl ether

Concentration: 0.2% by weight

Spinner speed: 3500 rpm

Duration of spinning: 5 seconds

On the spin-coated layer were formed the hole transport layer, emission layer, electron injection layer, and cathode in the same way as in Comparative Example 1. Thus there was obtained the desired organic electroluminescence device. It has the same characteristic properties as in Example 1.

Comparative Example 2

The hole injection layer 3 was formed on the ITO glass substrate from triphenylamine-containing polyether (MW=29000) represented by the formula below, by spin coating under the following conditions.

This compound was synthesized by the method proposed by Kido et al. (See Polymer for Advanced Technologies, vol. 7, p. 31, 1996, and Japanese Patent Laid-open No. Hei 9-188756.)

Conditions of spin coating:

Solvent: chloroform

Concentration: 0.01 g/ml

Spinner speed: 3100 rpm

Duration of spinning: 5 seconds

On the spin-coated layer were formed the hole transport layer, emission layer, electron injection layer, and cathode in the same way as in Comparative Example 1. Thus there was obtained the desired organic electroluminescence device. It has the characteristic properties shown in Table 1.

Example 3

The hole injection layer 3 was formed on the ITO glass substrate from a material composed of the triphenylamine-containing polyether (used in Comparative Example 2) and 30% by weight of A-6 (synthesized in Example 1), by spin coating under the same conditions as in Comparative Example 1.

On the spin-coated layer were formed the hole transport layer, electron transport emission layer, electron injection layer, and cathode in the same way as in Comparative Example 1. Thus there was obtained the desired organic electroluminescence device. It has the characteristic properties shown in Table 1.

Example 4

The hole injection layer 3 was formed on the ITO glass substrate from a material composed of the triphenylamine-containing polyether (MW=12000) represented by the formula below and 30% by weight of A-6, by spin coating under the same conditions as in Comparative Example 1. The triphenylamine-containing polyether was synthesized by the above-mentioned method proposed by Kido et al.

On the spin-coated layer were formed the hole transport layer, emission layer, electron injection layer, and cathode in the same way as in Comparative Example 1. Thus there was obtained the desired organic electroluminescence device. It has the characteristic properties shown in Table 1.

Comparative Example 3

The hole injection layer 3 was formed on the ITO glass substrate from a polyvinylcarbazole (reagent made by Kanto Kagaku) represented by the formula below, by spin coating under the same conditions as in Comparative Example 1.

On the spin-coated layer were formed the hole transport layer, electron transport emission layer, electron injection layer, and cathode in the same way as in Comparative Example 1. Thus there was obtained the desired organic electroluminescence device. It has the characteristic properties shown in Table 1.

Comparative Example 4

An attempt was made to form the hole injection layer 3 from a material composed of the polyvinylcarbazole (used in Comparative Example 3) and 5% by weight of the compound represented by the formula below (disclosed in Japanese Patent Laid-open No. Hei 11-283750). The attempt was unsuccessful because gelation took place immediately after mixing.

Example 5

The hole injection layer 3 was formed on the ITO glass substrate from a material composed of the polyvinylcarbazole (used in Comparative Example 3) and 5% by weight of A-6, by spin coating under the same conditions as in Comparative Example 1.

On the spin-coated layer were formed the hole transport layer, electron transport emission layer, electron injection layer, and cathode in the same way as in Comparative Example 1. Thus there was obtained the desired organic electroluminescence device. It has the characteristic properties shown in Table 1.

Examples 6 to 8

The hole injection layer 3 was formed on the ITO glass substrate from a material composed of the triphenylamine-containing polyether (used in Comparative Example 2) and 5% by weight of A-5, A-7, and A-8, respectively, by spin coating under the same conditions as in Comparative Example 1.

On the spin-coated layer were formed the hole transport layer, electron transport emission layer, electron injection layer, and cathode in the same way as in Comparative Example 1. Thus there was obtained the desired organic electroluminescence device. It has the characteristic properties shown in Table 1.

Incidentally, A-5, A-7, and A-8 were synthesized in the same way as in Example 1.

TABLE 1

| | Designation of compound | Threshold voltage for emission (V) | Voltage at 100 cd/m$^2$ (V) | Voltage at 500 cd/m$^2$ (V) |
|---|---|---|---|---|
| Comparative Example 1 | | 6 | 10.5 | 11 |
| Comparative Example 2 | | 5 | 10 | 11.5 |
| Comparative Example 3 | | 10.5 | 16 | 17 |
| Example 1 | A-6 | 3.5 | 8 | 9.5 |
| Example 3 | A-6 | 3 | 6 | 8 |
| Example 4 | A-6 | 3 | 6.5 | 8.5 |
| Example 5 | A-6 | 3.5 | 11.5 | 13.5 |
| Example 6 | A-5 | 3 | 6 | 8 |
| Example 7 | A-7 | 3 | 6.5 | 9 |
| Example 8 | A-8 | 3 | 6.5 | 9 |

INDUSTRIAL APPLICABILITY

The present invention makes it possible to easily produce long-lived defect-free organic electroluminescence devices capable of intensive emission at a low voltage. The organic electroluminescence device of the present invention is suitable for displays of various apparatus.

The invention claimed is

1. An organic electroluminescence device of the type having one or more than one emission layer in the form of thin film of an organic compound between paired electrodes, which includes at least one layer containing a compound with carbenium ion.

2. The organic electroluminescence device as defined in claim 1, wherein the compound with carbenium ion is one which is represented by the formula (1) below (1)

(where Ar$^1$ to Ar$^3$ denote identical or different, substituted or unsubstituted aromatic groups; and R$^-$denotes an anion species.

3. The organic electroluminescence device as defined in claim 1 or 2, wherein the layer containing the compound with carbenium ion is a hole transport layer.

4. The organic electroluminescence device as defined in claim 1 or 2, wherein the layer containing the compound with carbenium ion is a hole injection layer.

5. The organic electroluminescence device as defined in claim 1 or 2, wherein the layer containing the compound with carbenium ion is and electron transport layer.

6. The organic electroluminescence device as defined in claim 1 or 2, wherein the layer containing the compound with carbenium ion is an electron injection layer.

* * * * *